US 6,417,041 B1
Jul. 9, 2002

(54) METHOD FOR FABRICATING HIGH PERMITIVITY DIELECTRIC STACKS HAVING LOW BUFFER OXIDE

(75) Inventor: Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/277,511

(22) Filed: Mar. 26, 1999

(51) Int. Cl.⁷ .................. H01L 21/20; H01L 21/8242; H01L 21/00

(52) U.S. Cl. .................. 438/240; 438/3; 438/396

(58) Field of Search .................. 438/3, 240, 396

(56) References Cited

U.S. PATENT DOCUMENTS

| | | | |
|---|---|---|---|
| 4,698,787 A | | 10/1987 | Mukherjee et al. .......... 365/185 |
| 4,877,641 A | * | 10/1989 | Dory .......................... 427/38 |
| 5,352,623 A | * | 10/1994 | Kamiyama .................. 438/396 |

(List continued on next page.)

FOREIGN PATENT DOCUMENTS

| | | | |
|---|---|---|---|
| EP | 0 637 063 A1 | | 1/1995 |
| EP | 0637063 A1 | * | 2/1995 |
| EP | 0900859 A2 | * | 6/1998 |
| FR | 2 766 211 A1 | | 1/1999 |
| FR | 2766211 A | * | 1/1999 |
| JP | 406232411 A | * | 8/1994 |

OTHER PUBLICATIONS

Tiner et al.; Extending the Use of NO Dielectrics for DRAM by Ultrathin Silicon Nitride RTCVD with In Situ Ammonia and Hydrogen Pre–Deposition Surface Conditioning; Rapid Thermal & Integrated Processing VI. Symposium; Apr. 1997; Mater. Res. Soc.; pp. 387–392.*

Tiner, et al., "Extending the Use of NO Dielectrics for DRAM by Ultrathin Silicon Nitride RTCVD with In Situ Ammonia and Hydrogen Pre–Deposition Surface Conditioning," *Rapid Thermal and Integrated Processing VI. Symposium, Rapid Thermal and Integrated Processing VI. Symposium, San Francisco, CA, USA, Apr. 1–4, 1997*, pp. 387–392, XP000925775, 1997, Pittsburgh, PA, USA, ISBN: 1–55899–374–6.

Copy of PCT Search Report mailed Sep. 8, 2000.

(List continued on next page.)

*Primary Examiner*—Caridad Everhart
*Assistant Examiner*—Chuong A Luu
(74) *Attorney, Agent, or Firm*—Fliesler, Dubb, Meyer & Lovejoy

(57) ABSTRACT

Methods of manufacturing insulating materials having high dielectric constants are disclosed, in which the high-dielectric constant material is deposited on a semiconductor surface that has been treated to remove layers of low-dielectric constant dielectric material which form on the surfaces of semiconductor wafers during manufacturing and conventional wafer preparation. During conventional wafer preparation, a layer of oxide forms on the surface of the semiconductor substrate. The oxide has a lower dielectric constant than the desired high-dielectric constant insulator, therefore, the presence of this layer of native oxide effectively lowers the dielectric constant of the overall insulating film. The methods of this invention involve heating the wafer in an environment containing an oxide reducing material. The oxide reducing material chemically reduces the semiconductor substrate, thereby decreasing the amount of oxide present on the surface of the wafer. Thereafter, the layers of high dielectric constant materials can be deposited, resulting in an overall insulating film having a dielectric constant that more closely reflects the dielectric constant of the high-dielectric constant insulating material. Therefore, the insulating films can be made thinner, thereby permitting high voltage components to be manufactured closer together on the semiconductor wafer, thus increasing device density, increasing efficiency, and decreasing manufacturing costs.

23 Claims, 2 Drawing Sheets

U.S. PATENT DOCUMENTS

| | | | | |
|---|---|---|---|---|
| 5,374,586 A | * | 12/1994 | Huang et al. | 437/69 |
| 5,470,773 A | | 11/1995 | Liu et al. | 437/43 |
| 5,492,854 A | * | 2/1996 | Ando | 438/396 |
| 5,511,026 A | | 4/1996 | Cleveland et al. | 365/189.09 |
| 5,663,088 A | * | 9/1997 | Sandhu et al. | 438/396 |
| 5,824,590 A | * | 10/1998 | New | 438/393 |
| 5,909,624 A | * | 6/1999 | Yeager et al. | 438/396 |
| 5,939,333 A | * | 8/1999 | Hurley | 437/241 |
| 6,004,875 A | * | 12/1999 | Cathey et al. | 438/634 |
| 6,013,943 A | * | 1/2000 | Cathey et al. | 257/640 |
| 6,020,024 A | * | 2/2000 | Maiti et al. | 427/248.1 |
| 6,037,235 A | * | 3/2000 | Narwankar | 438/396 |
| 6,071,771 A | * | 6/2000 | Schuegraf | 438/240 |
| 6,077,737 A | * | 6/2000 | Yang et al. | 438/240 |
| 6,127,287 A | * | 10/2000 | Hurley et al. | 438/791 |
| 6,136,641 A | * | 10/2000 | Won et al. | 438/240 |
| 6,143,128 A | * | 11/2000 | Ameen et al. | 156/345 |
| 6,228,752 B1 | * | 5/2001 | Miyano | 438/592 |

OTHER PUBLICATIONS

Kang Deoh Suh, et al., *A 3.3 V 32Mb NAND Flash Memory with Incremental Step Pulse Programming Scheme*, IEEE Journal of Solid–State Curcuits, vol. 30, No. 11, Nov. 1995, pp. 1149–1155.

Gheorghe Samachisa, et al., *A 128 K Flash EEPROM Using Double–Polysilicon Technology*, IEEE Journal of Solid–State Circuits, vol. Sc–22, No. 5, Oct., 1987, pp. 676–683.

* cited by examiner

METHOD FOR FABRICATING HIGH PERMITIVITY DIELECTRIC STACKS HAVING LOW BUFFER OXIDE

BACKGROUND OF THE INVENTION

1. Field of the Invention

This invention relates to the manufacture of semiconductor devices, particularly devices having high dielectric-constant insulators.

2. Description of Related Art

Semiconductor memory storage capacity can be limited by the size of semiconductor devices manufactured on a semiconductor chip. As the desired memory size increases to meet increasing demands for more powerful computing, it is desirable to decrease the size of semiconductor devices accordingly. Semiconductor device size is limited, in part, by the ability of the conductive pathways ("conductive lines") to remain electrically isolated from each other. Conductive lines can be made of a metal, which can be aluminum, copper, or other suitable metal, or can be another type of conducting material such as, by way of example only, polycrystalline silicon ("polysilicon").

I. High Dielectric Constant Insulators

Electrical isolation of conductive lines is typically carried out by layers of insulating materials deposited in between and over conductive lines. As the size of device features become smaller in advanced semiconductor manufacturing processes, the conductive lines are required to be closer together, that is, the spacing between conductive lines becomes smaller. As the spacing of conductive lines becomes smaller, there is less room available for the insulating material. Therefore, it is desirable for the insulating properties of the insulator to be sufficiently high to prevent leakage of unwanted electrical currents between conductive lines.

One important property of insulators is the dielectric constant (K). The dielectric constant is a measure of the ability of an insulator to prevent the discharge of electrical current between conductive electrodes through the insulator. Thus, better insulators have higher dielectric constants. The dielectric constant is quantified by comparing the insulating ability of an insulating material to the insulating ability of air, which is defined to have a dielectric constant of 10. For example, the commonly used dielectric material, silicon dioxide, has a dielectric constant of about 4. Insulators having high dielectric constants are defined herein to have dielectric constants of greater than about 4, and insulators having low dielectric constants are defined herein to have dielectric constants of less than about 4. For high-voltage applications, it is desirable to use insulators having high dielectric constants.

The thickness of an insulating layer can limit the minimum device size and conductive line spacing. In general, insulators having low dielectric constants must be thicker to provide an equivalent degree of insulation compared to insulators having higher dielectric constants. As semiconductor device sizes and spacing between conductive lines become smaller, insulating materials having higher dielectric constants are desirable. Furthermore, manufacturing of features having sizes in the sub-micron range requires that the insulating material be capable of being applied to the semiconductor device easily with a minimum of gaps or variations in thickness of the insulating layer.

An example of an insulating material having a high dielectric constant is tantalum pentoxide ($Ta_2O_5$), which can form a film having a dielectric constant of about 30. Tantalum pentoxide can be deposited by chemical vapor deposition (CVD) from the ortho-ethyl derivatized precursor, $Ta(OC_2H_5)_5$. In a CVD apparatus, the precursor is dissociated to form reactive intermediates, including tantalum oxide radicals and ethyl moieties. The tantalum oxide radicals can be deposited on a semiconductor surface and can react to form a cross-linked crystalline film comprising tantalum pentoxide.

Other high-dielectric constant materials include, by way of example, tungsten, zirconium, strontium, barium-strontium and titanium oxides. These materials can be deposited from O-derivatized carbon-containing precursors in ways similar to those for tantalum pentoxide. A general structure for O-derivatized precursors suitable for deposition of high-dielectric constant materials according to this invention is: Mem(O—R)n, where Me is a metal atom, m and n are integers, 0 is an oxygen atom, and R is a carbon-containing leaving group. By way of example only, leaving groups suitable for deposition of high-dielectric constant layers include alkyl groups such as O-ethyl, O-methyl, O-propyl, O-isopropyl, O-butyl, O-isobutyl, and other leaving groups known in the art. Regardless of the type of O-derivatized carbon-containing precursor, during typical CVD deposition processes, some of the carbon from the leaving groups liberated during dissociation can become deposited in the thin film. The carbon atoms, if present, contaminate the thin film, and must be removed. Removal of these contaminants can be accomplished by exposing the film to high temperatures in an environment containing an oxidant, such as by way of example only, oxygen. When treated at temperatures of about 600° C. to about 900° C., alternatively about 800° C., the contaminating carbon atoms can oxidize to form carbon dioxide ($CO_2$), which is volatile, and can be exhausted from the CVD chamber.

During the oxidation process however, some oxygen can diffuse through the tantalum pentoxide layer and can reach the surface of the silicon substrate, oxidizing the silicon substrate, forming a layer of silicon dioxide, herein termed "buffer oxide". Because silicon dioxide has a dielectric constant of about 4, this layer of buffer oxide effectively decreases the dielectric constant of the insulating film, thereby decreasing the insulating capability of the thin film.

II. Native Oxide Deceases Dielectric Constant of High Dielectric Constant Materials In addition to the formation of buffer oxide described above, another source of silicon dioxide which can adversely affect high dielectric constant layers is commonly formed on semiconductor substrates. Newly manufactured silicon wafers typically have been exposed to oxygen during either manufacture and/or storage, thereby forming a layer of silicon dioxide, herein termed "native oxide." Even after exposing the wafer to HF and then cleaning the wafer (in what we commonly refer to as "pre-gate oxide clean" steps), a layer of native oxide can remain, having a thickness in the range of 8 Å to about 10 Å. This native oxide layer can have variable stoichiometry, wherein the ratio of oxygen atoms to silicon atoms is not integral. Thus, the chemical formula for this layer of native oxide can be stated as $SiO_{\sim 2}$. Furthermore, under high-temperature oxidizing conditions as described above for the oxidation of contaminating carbon atoms, the silicon substrate underlying the native oxide can become oxidized, thus forming an additional thickness of buffer oxide that can have a thickness in excess of 30 Å. By having a dielectric constant of about 4, substantially lower than the desired K for the insulating layer, the native and buffer oxide layers can defeat the purpose of depositing the layer of high dielectric constant material.

The problems associated with prior art manufacturing processes are depicted in FIGS. 1–3. In FIGS. 1–3, identical elements have the same identifying numbers. FIG. 1 is a drawing depicting a semiconductor wafer 100 comprising a silicon substrate 104 having a layer of native oxide 108 formed on the surface of substrate 104. After the pre-gate oxide clean steps, the thickness of the native oxide layer 108 is typically in the range of about 8 Å to about 10 Å. FIG. 2 is a drawing depicting the same semiconductor wafer depicted in FIG. 1, having silicon substrate 104, native oxide layer 108, a nitride layer 112 and a layer of tantalum pentoxide 116 deposited on top of nitride layer 112. Tantalum pentoxide layer 116 is drawn stippled to depict the presence of carbon contamination. FIG. 3 is a drawing depicting the same semiconductor wafer as depicted in FIGS. 1–2, comprising silicon substrate 104, oxide layer 108, nitride layer 112 and tantalum pentoxide layer 116, but after oxidation at about 600° C. in an oxygen-containing atmosphere. The oxidation removes carbon contaminants from tantalum pentoxide layer 116, and results in a high-dielectric constant film having a thickness of about 100 Å. However, the oxidation increased the thickness of oxide layer 108 compared to the native oxide layer shown in FIGS. 1 and 2.

The problem of native oxide and buffer oxide growth is especially important for applications in which the layer of high dielectric constant material is to be very thin. Not only is the overall thickness of the dielectric layers (the "mixed dielectric" layer comprising buffer oxide and high dielectric material) larger than desired thickness (about 20 Å), but the dielectric constant of the mixed dielectric material can be substantially lower than that of a layer of pure high dielectric constant material. The lower dielectric constant of the mixed dielectric material can limit device density and therefore semiconductor processing speed.

Therefore, an object of this invention is the manufacture of layers of insulating materials having a high dielectric constant while minimizing the contamination of the underlying semiconductor substrate with native oxide and buffer oxide.

Another object of this invention is the manufacture of thin layers of materials having high dielectric constant.

Another object of this invention is the development of methods and processes for deposition of thin layers of materials having high dielectric constant that can be easily integrated into existing semiconductor manufacturing processes.

SUMMARY OF THE INVENTION

Thus, this invention provides methods for decreasing the thickness of native oxide layers and for decreasing the growth of buffer oxide layers on a semiconductor wafer. The processes of this invention involve annealing the wafer under reducing conditions, such as in a low pressure atmosphere comprising a reducing agent being substantially free of oxygen. This annealing process reduces the thickness of the native oxide layer. Then, while oxygen is excluded from the chamber, a thin barrier layer is manufactured on top of the semiconductor substrate, and subsequently, a layer of high dielectric material is deposited on the top of the barrier layer. The barrier layer can decrease the diffusion of carbon atoms into the silicon substrate. Subsequent exposure of the wafer to high-temperature oxidation can decrease the amounts of carbon contaminants in the high-K film, and the barrier layer can decrease the amount of oxygen that can diffuse through to the substrate, thereby decreasing formation of buffer oxide. The reduction in thickness of both native oxide and buffer oxide layers decreases the amount of low-K material in the insulating layer, and thus can mitigate the decrease in K caused by dilution of the insulating layer by oxides. Thus, the K of the overall insulating layer can approach the K values for pure high-K dielectric materials.

Thus, one aspect of this invention is the annealing of semiconductor wafers in a reducing environment comprising hydrogen or ammonia gas to decrease native oxide present on the wafer.

Another aspect of this invention is the deposition of a barrier layer over a substrate from which the native oxide has been removed.

Another aspect of this invention is the formation of a barrier layer of nitride on the semiconductor substrate by rapid thermal annealing in the presence of ammonia gas.

A further aspect of this invention is the deposition of a thin layer of a high K material over a barrier layer of nitride.

An additional aspect of this invention is the manufacture of semiconductor devices having a thin film of insulating materials having a high dielectric constant.

BRIEF DESCRIPTION OF THE FIGURES

The invention will be described with respect to the particular embodiments thereof. Other objects, features, and advantages of the invention will become apparent with reference to the specification and drawings in which.

DETAILED DESCRIPTION

To manufacture a thin, highly controllable high dielectric constant layer of dielectric material, the semiconductor wafer is first cleaned according to methods known in the art. These steps can include exposing the wafer to HF and then cleaning the wafer, using the pre-gate oxide clean procedure. This conventional cleaning step can decrease the thickness of the native oxide layer, but generally, even after this step, the native oxide layer can have a thickness in the range of about 8 Å to about 10 Å. To further decrease the thickness of this native oxide layer, a novel process in accord with the present invention is performed, wherein the wafer is then exposed to elevated temperatures in a reducing environment to chemically reduce the native oxide layer, The chemical reduction decreases the amount of oxygen in the native oxide layer, which typically is in the form of $SiO_2$. This exposure can be carried out in the same chamber which can be subsequently used for the deposition of other semiconductor layers, including high-dielectric constant insulating materials. Thus, the wafer need not be exposed to conditions which would promote the reformation of oxide prior to the deposition of the high dielectric constant material. The manufacturing process is illustrated by FIGS. 4–7. In the figures that follow, identical elements have the same identifying numbers.

Figure 1:
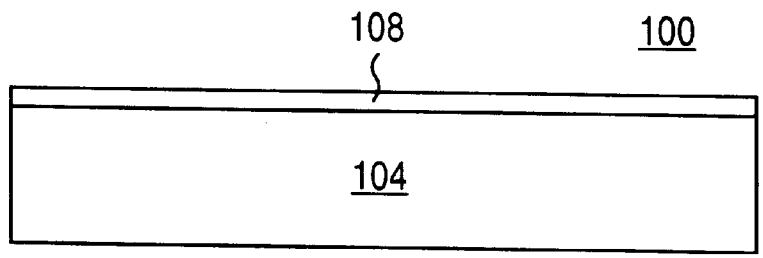
FIG. 1 depicts a silicon wafer of the prior art having a layer of native oxide.
Figure 2:
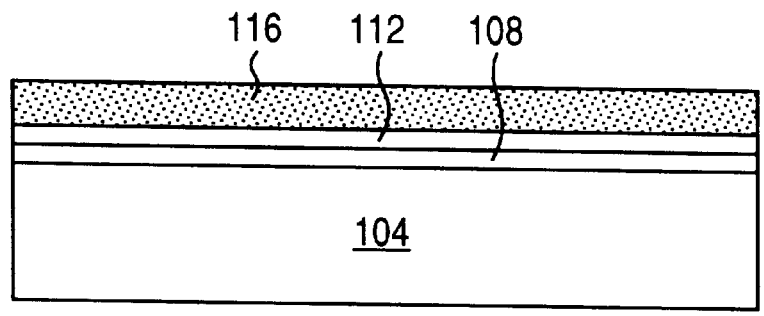
FIG. 2 depicts a silicon wafer of the prior art as shown in FIG. 1 after having a layer of tantalum pentoxide deposited on the native oxide, showing contamination of the tantalum pentoxide layer by carbon.
Figure 3:
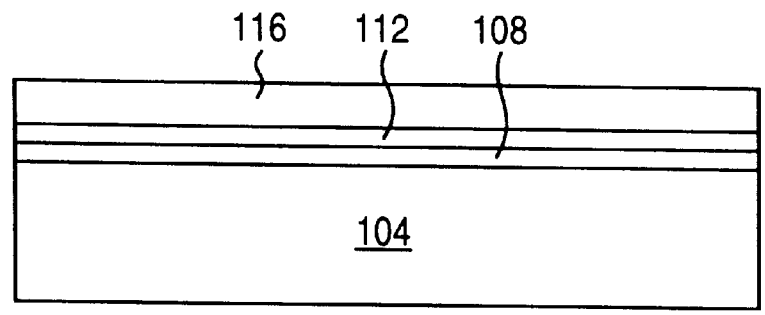
FIG. 3 depicts a silicon wafer of the prior art as shown in FIG. 2 after oxidation of the tantalum pentoxide layer to remove the contaminating carbon.
Figure 4:
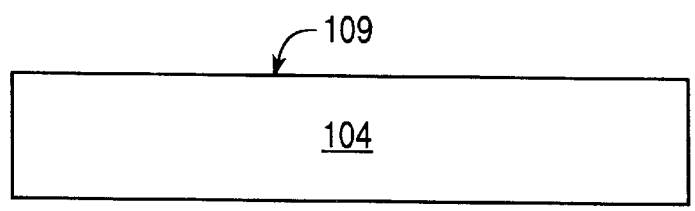
FIG. 4 depicts a silicon wafer similar to that shown in FIG. 1, but after decreasing the thickness of the layer of native oxide by annealing the wafer in a reducing environment.

After standard cleaning of a prior art wafer as shown in FIG. 1, the thickness of the native oxide layer is in the range of about 8 Å to about 10 Å. The process of decreasing the thickness of the native oxide is depicted in FIG. 4. FIG. 4 is a drawing depicting the same semiconductor wafer shown in FIG. 1 but having the layer of native oxide 108 chemically reduced by annealing the wafer at a temperature of 600° C. in the presence of hydrogen gas. The thickness of the layer of oxide remaining at surface 109 is in the range of about 1 Å to about 2 Å.

Generally, any reducing agent that does not contain oxygen can be used to reduce the oxide. By way of example, hydrogen and ammonia can be used. Moreover, the chemical reduction using ammonia can take place at temperatures in the range of about 250° C. to about 700° C., alternatively in the range of about 400° C. to about 600° C. and in another embodiment, at about 600° C. When hydrogen is used as the reducing agent, temperatures in the range of about 250° C. to about 1100° C. can be used. According to one theory, reduction of the native oxide layer occurs because the hydrogen can combine with the oxygen atoms of the native oxide layer, thereby forming $H_2O$, which is volatile and leaves the surface. The remaining surface thus comprises substrate with substantially no oxide present. However, other theories may account for the observed reduction of the native oxide layer.

Figure 5:
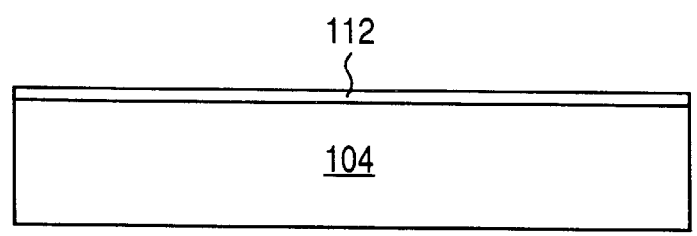
FIG. 5 depicts the silicon wafer of FIG. 4, after deposition of a layer of nitride on the silicon surface.

After the native oxide has been substantially removed, a barrier layer, comprising, by way of example, a nitride, is provided on the substrate surface. In those embodiments in which the barrier layer is a nitride layer, the nitride layer can be either deposited from silane and ammonia, or can be made by a nitridation process. FIG. 5 is a drawing of the same semiconductor wafer shown in FIG. 4, but with a thin layer of nitride 112 formed on the surface of substrate 104.

In one embodiment of this invention wherein the nitride layer is deposited, the hydrogen in the chamber can be exhausted and then a mixture of nitrogen ($N_2$) or other inert gas, such as by way of example only, helium, neon, argon or xenon, and ammonia ($NH_3$) comprising from about 1% to about 50% can be introduced into the chamber. The wafer can then be exposed to temperatures in the range of about 250° C. to about 600° C., or alternatively at about 500° C. for about 60 seconds. The time needed to form the nitride layer depends on the temperature. Silane ($SiH_4$) or other similar precursor can be introduced into the chamber and the chamber can be heated to a temperature of about 700° C., and the silane and ammonia can be dissociated into reactive intermediates. The reactive intermediates can combine with each other and be deposited on the silicon surface, thereby forming a layer of silicon nitride.

Alternatively, silicon nitride layer can be deposited in a chemical vapor deposition (PECVD) system using a source of radiofrequency (RF) energy having a power in the range of about 1 Watt/cm² to about 3 Watts/cm². The RF energy can generate a plasma that dissociates the precursors into reactive intermediates, which then can deposit on the substrate and form the nitride layer. The time for deposition of the nitride layer can be in the range of about 15 sec to about 30 sec.

The layer of nitride can also be provided by nitridation, wherein the silicon can be exposed to ammonia and a source of energy provided to cause chemical reactions to occur. Thermal nitridation can be carried out in a chamber heated to a temperature in the range of about 850° C. to about 1100° C. Nitridation can also be carried out using rapid thermal annealing ("RTA") using methods known in the art. Nitridation can be also carried out in the same chamber used for oxide reduction. In one embodiment of this invention, ammonia is used both for chemical reduction and nitridation. In the presence of ammonia, at temperatures below about 700° chemical reduction of silicon is the predominant reaction, because silicon and nitrogen atoms do not tend to form nitride at these temperatures. As the temperature is increased, nitridation can occur. At temperatures above about 700° C. and below about 850° C., a mixture of reduction and nitridation can occur, and at temperatures above about 850° C., nitridation is favored and reduction is not favored. Thus, in this embodiment, ammonia is introduced into the chamber and the chamber is heated to a temperature in the range of about 250° C. to about 700° C. to reduce the silicon, then the temperature is raised to above about 850° C., where nitridation occurs. Regardless of the method used to form the nitride barrier layer, reaction conditions are chosen to provide a layer of nitride having a thickness in the range of about 5 Å to about 20 Å on the silicon surface.

Subsequent to the formation of nitride layer on the silicon substrate, a layer of high dielectric material can be deposited. Any material having a sufficiently high dielectric constant can be deposited. The dielectric constant can be in the range of about 5 to about 75, or alternatively about 30. For deposition of other high dielectric constant insulating layers, process conditions can be selected that are known in the art, or can be determined using methods that are routine in the art.

One example of a suitable high dielectric constant material is tantalum pentoxide ($Ta_2O_5$). Tantalum pentoxide is typically deposited from the precursor, $Ta(OC_2H_5)_5$, using chemical vapor deposition (CVD). The volatilized precursor can be present in the chamber in a concentration in the range of about 1% by volume to about 50% by volume, alternatively in the range of about 10% to about 20% by volume, and in another embodiment, about 10% by volume, with the remainder being an inert gas, such as by way of example only, nitrogen, argon, helium, neon, or xenon. The dissociation temperature is selected to provide substantially complete dissociation of the precursor into reactive intermediates. For dissociating $Ta(OC_2H_5)_5$, temperatures in the range of about 400° C. to about 850° C., alternatively, in the range of about 400° C. to about 550° C. can be used.

In embodiments in which PECVD is used to dissociate the precursor, radiofrequency power in the range of about 1 Watt/cm² to about 3 Watts/cm² can be used. The pressure in the chamber can be from about 100 milliTorr to about 100 Torr, and the time of deposition can be selected to provide a layer of nitride having an oxide equivalent thickness in the range of about 5 Å to about 20 Å.

The "oxide equivalent thickness" or $Ox_{eq}$ can be calculated as follows:

$$Ox_{eq} = \frac{Tx4}{K},$$

where T is the thickness in Å of the high-dielectric constant material, 4 is the dielectric constant of oxide, and K is the dielectric constant of the high-dielectric constant material. The dielectric constant of a oxidized tantalum pentoxide film is about 30. The thickness of the tantalum pentoxide layer as deposited can be in the range of about 40 Å to about 150 Å, alternatively in the range of about 70 Å to about 100 Å, and in another embodiment, about 70 Å.

Figure 6:
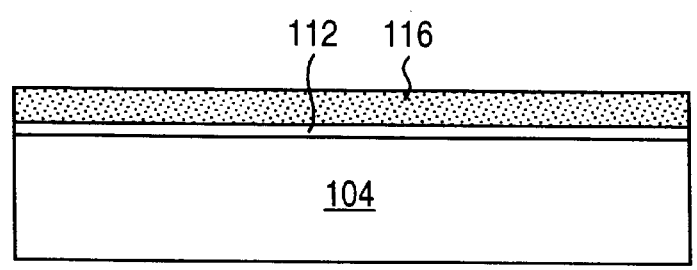
FIG. 6 depicts the silicon wafer of FIGS. 4 and 5, after the deposition of a layer of tantalum pentoxide, and showing the contamination of the tantalum pentoxide layer by carbon.

FIG. 6 is a drawing depicting the same semiconductor wafer as shown in FIGS. 4–5, comprising substrate 104 having nitride layer 112, and after the deposition of a layer of tantalum pentoxide 116 on the surface of nitride layer 112. Tantalum pentoxide layer 116 is depicted as stippled having contaminating carbon atoms.

After its deposition, the layer of $Ta_2O_5$ can have a crystalline structure but also comprising an admixture of carbon derived from the leaving groups (e.g., —$C_2H_5$) of the precursor. The carbon contaminants can be removed by heating the wafer in an oxygen atmosphere to temperatures of greater than about 800° C. for about 1 minute to about 20 minutes, alternatively about 5 minutes. After annealing and oxidation, the oxide equivalent thickness of the high-dielectric constant layer can range from about 2 Å to about 20 Å, and in another embodiment, about 5 Å.

Figure 7:
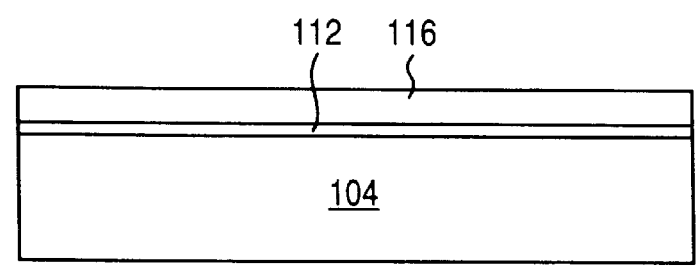
FIG. 7 depicts the silicon wafer of FIGS. 4–6, after oxidation of the tantalum pentoxide layer to remove the contaminating carbon.

FIG. 7 is a drawing of the same semiconductor wafer as depicted in FIGS. 4–6, comprising substrate 104, nitride layer 112 and tantalum pentoxide layer 116 after oxidation of layer 116. The oxygen in the reaction chamber can react with the carbon in tantalum pentoxide layer 116 to form carbon dioxide ($CO_2$), which is volatile and can leave the tantalum pentoxide layer and be exhausted from the chamber.

Because the native oxide layer is substantially removed from the silicon substrate during the manufacturing process, there is little material having a dielectric constant of about 4. As a result, the overall dielectric constant of the insulating film can be determined primarily by the dielectric constant of the high dielectric material, and to a much lesser degree by oxide, and the dielectric constant of the overall insulating layer can approach that of a layer of pure high dielectric constant material. By having a higher dielectric constant, the high dielectric layer need not be as thick as the layers of the prior art, because no additional high dielectric constant material is needed to compensate for the relatively lower dielectric constant contribution of the oxide present in the prior art. Thus, by selecting a high-dielectric constant material having a dielectric constant of about 75, and a layer the equivalent oxide thickness can be about 2.6 Å. By decreasing the oxide equivalent thickness, the total capacitance of the film increases, thereby providing more efficient insulation.

INDUSTRIAL APPLICABILITY

The methods of this invention provide for the manufacture of layers of insulating material having high dielectric constant without dilution of the insulating capability of the layer by low-dielectric constant oxides. These high-dielectric constant layers are useful for the insulation of high voltage features in semiconductor devices, such as conductive lines. By eliminating low dielectric constant layers from the semiconductor device prior to deposition of the high dielectric constant material, the overall dielectric constant of the layers can be made higher than previously. Therefore, the layers of insulation can be more effective, and therefore can be thinner than previously possible, thus permitting the miniaturization of semiconductor devices.

What is claimed is:

1. A method for manufacturing an insulating layer having a high dielectric constant on a semiconductor wafer having a substrate with a layer of native oxide thereon, said method comprising the steps of:
    (a) heating said wafer in the presence of an oxide reducing agent sufficient to reduce said native oxide; then
    (b) providing a barrier layer having a thickness between about 5 Å and about 20 Å on said substrate; and
    (c) depositing a layer of insulating material having a high dielectric constant on said barrier layer.

2. The method of claim 1, further comprising the step of heating said wafer in the presence of an oxidant.

3. The method of claim 1, wherein the barrier layer is a nitride layer.

4. The method of claim 1, wherein the insulating material having a high dielectric constant is tantalum pentoxide.

5. The method of claim 1, wherein said oxide reducing agent is ammonia and the step of heating said wafer in the presence of said oxide reducing agent is carried out at a temperature in the range of about 250° C. to about 700° C.

6. The method of claim 1, wherein said oxide reducing agent is hydrogen and the step of heating said wafer in the presence of said oxide reducing agent is carried out at a temperature in the range of about 250° C. to about 1100° C.

7. The method of claim 3, wherein said nitride layer is made by plasma enhanced chemical vapor deposition carried out using at least one deposition variable selected from the group consisting of a radiofrequency power in the range of about 1 Watt/$cm^2$ to about 3 Watts/$cm^2$, a deposition time in the range of about 15 seconds to about 30 seconds and a total pressure in the range of about 100 milliTorr to about 100 Torr.

8. The method of claim 3, wherein said nitride layer is deposited by introducing ammonia into said chamber and heating said chamber to a temperature in the range of about 250° C. to about 600° C. for about 1 minute, and then by introducing a silane into said chamber and heating said chamber to a temperature of about 700° C., wherein said ammonia and said silane dissociate to form reactive intermediates which combine and deposit to form a layer of nitride on said wafer.

9. The method of claim 3, wherein said nitride layer is made by nitridation.

10. The method of claim 9, wherein said nitridation is carried out in the presence of ammonia at a temperature in the range of about 700° C. to about 1100° C.

11. The method of claim 3, wherein said layer of nitride has a thickness in the range of about 5 Å to about 20 Å.

12. The method of claim 1, wherein said layer of insulating material has a dielectric constant in the range of about 5 to about 75.

13. The method of claim 1, wherein said layer of insulating material is deposited from a precursor having the structure: $Me_m(O—R)_n$, wherein Me is a metal, R is a carbon-containing leaving group and m and n are integers.

14. The method of claim 13, wherein said metal is selected from the group consisting of tantalum, tungsten, zirconium, strontium, barium strontium and titanium.

15. The method of claim 13, wherein R is selected from the group consisting of methyl, ethyl, propyl, isopropyl, butyl and isobutyl moieties.

16. The method of claim 13, wherein said layer of insulating material is deposited using at least one deposition variable selected from the group consisting of a precursor concentration in the range of about 1% to about 50% in an inert gas and a temperature in the range of about 400° C. to about 850° C.

17. The method of claim 16, wherein said inert gas is selected from the group consisting of He, Ne, $N_2$, Ar and Xe.

18. The method of claim 1, wherein said high dielectric constant material has a thickness as deposited in the range of about 40 Å to about 150 Å.

19. The method of claim 1, wherein said insulating material comprises tantalum pentoxide.

20. The method of claim 2, wherein after heating said wafer in the presence of an oxidant, said high dielectric constant material has a oxide equivalent thickness in the range of about 2 Å to about 20 Å.

21. The method of claim 1, wherein the concentration of said oxide reducing agent is in the range of about 1% to about 50% by volume.

22. The method of claim 2, wherein said step of heating said wafer is carried out using oxygen.

23. The method of claim 2, wherein said step of heating said wafer in the presence of an oxidant is carried out at least one of a temperature is in the range of about 600° C. to about 900° C., and a time in the range of about 1 minute to about 20 minutes.

* * * * *